(12) United States Patent
Chihaya et al.

(10) Patent No.: US 10,748,750 B2
(45) Date of Patent: Aug. 18, 2020

(54) SUBSTRATE PROCESSING APPARATUS

(71) Applicant: TOKYO ELECTRON LIMITED, Tokyo (JP)

(72) Inventors: Hiroaki Chihaya, Nirasaki (JP); Hiroshi Sone, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 56 days.

(21) Appl. No.: 16/208,391

(22) Filed: Dec. 3, 2018

(65) Prior Publication Data

US 2019/0172690 A1    Jun. 6, 2019

(30) Foreign Application Priority Data

Dec. 5, 2017  (JP) ................................. 2017-233438

(51) Int. Cl.
*H01J 37/34* (2006.01)
*H01J 37/32* (2006.01)
*C23C 14/54* (2006.01)
*C23C 14/50* (2006.01)
*C23C 14/34* (2006.01)

(52) U.S. Cl.
CPC ...... *H01J 37/3447* (2013.01); *C23C 14/3407* (2013.01); *C23C 14/505* (2013.01); *C23C 14/54* (2013.01); *H01J 37/32449* (2013.01); *H01J 37/345* (2013.01); *H01J 37/3435* (2013.01)

(58) Field of Classification Search
CPC ... C23C 14/24; C23C 14/3407; C23C 14/505; C23C 14/54; C23C 14/56; C23C 14/5853; H01J 37/32449; H01J 37/3435; H01J 37/3447; H01J 37/345
USPC ........................................ 204/298.11, 298.07
See application file for complete search history.

(56) References Cited

U.S. PATENT DOCUMENTS

2004/0194702 A1   10/2004  Sasaki et al.
2016/0251746 A1    9/2016  Kojima et al.

FOREIGN PATENT DOCUMENTS

| JP | 2003-124108 A | 4/2003 |
| JP | 2004-076150 A | 3/2004 |
| KR | 10-2008-0035284 A | 4/2008 |
| WO | WO 2015/064194 A1 | 5/2015 |

*Primary Examiner* — Rodney G McDonald
(74) *Attorney, Agent, or Firm* — Fenwick & West LLP

(57) ABSTRACT

A substrate processing apparatus includes a supporting table having a mounting region for a substrate. A rotation shaft supporting a shutter extends in a vertical direction. The shutter is moved between a first region above the supporting table and a second region by rotating the rotation shaft about its central axis. The shutter includes a pipe having gas output holes. When the shutter is disposed in the first region, the gas output holes are located outside the mounting region in a rotation direction from the second region toward the first region. The minimum distance between the central axis and the gas output holes is smaller than or equal to the minimum distance between the central axis and the mounting region. The maximum distance between the central axis and the gas output holes is greater than equal to the maximum distance between the central axis and the mounting region.

6 Claims, 8 Drawing Sheets

SUBSTRATE PROCESSING APPARATUS

CROSS-REFERENCE TO RELATED APPLICATIONS

This application claims priority to Japanese Patent Application No. 2017-233438 filed on Dec. 5, 2017, the entire contents of which are incorporated herein by reference.

FIELD OF THE INVENTION

The present disclosure relates to a substrate processing apparatus.

BACKGROUND OF THE INVENTION

In manufacturing electronic devices, substrate processing is performed. In the substrate processing, a substrate is mounted on a supporting table provided in a chamber. A gas is supplied to the substrate on the supporting table. In the substrate processing, it is required to supply the gas to the entire surface of the substrate to process the entire surface of the substrate, i.e., the top surface of the substrate opposite to the backside of the substrate facing the supporting table.

Substrate processing apparatuses for substrate processing are described in Japanese Patent Application Publication No. 2004-076150 and PCT Publication No. 2015/064194. In the substrate processing apparatus described in Japanese Patent Application Publication No. 2004-076150, a substrate is mounted on a substrate holder that is a supporting table. A gas is supplied to the substrate on the substrate holder from a plurality of gas output holes. The opening ends of the gas output holes face the substrate and are arranged on a straight line. The substrate holder is rotated so that the gas from the gas output holes is supplied to the entire surface of the substrate.

The substrate processing apparatus described in PCT Publication No. 2015/064194 is a film forming apparatus using physical vapor deposition. The substrate processing apparatus described in PCT Publication No. 2015/064194 includes a chamber, a supporting table, and a head. The supporting table is provided in the chamber. A metal film is formed on the substrate mounted on the support table by physical vapor deposition. The metal film is converted to a metal oxide film by supplying an oxidizing gas to the substrate from the gas output holes of the head. The opening ends of the gas output holes are arranged on a straight line. The supporting table is rotated so that the gas from the gas output holes is supplied to the entire surface of the substrate.

There may be a case where the substrate processing apparatus cannot include a mechanism, i.e., a rotation mechanism, for rotating the supporting table. In that case as well, it is required to supply a gas to the entire surface of the substrate, i.e., the entire top surface of the substrate opposite to the backside of the substrate facing the support table.

SUMMARY OF THE INVENTION

In accordance with an aspect, there is provided a substrate processing apparatus including a chamber, a supporting table, a shutter, a rotation shaft and a driving unit. The chamber provides an inner space. The supporting table is provided in the inner space, the supporting table having a mounting region for mounting a disc-shaped substrate. The shutter has a pipe providing a plurality of gas output holes opened downward. The shutter is configured to cover the mounting region when the shutter is disposed in a first region above the supporting table. The rotation shaft is configured to support the shutter and spaced apart from the supporting table, the rotation shaft extending in a vertical direction. The driving unit is configured to move the shutter between the first region and a second region spaced apart from the supporting table by rotating the rotation shaft about a central axis thereof. The gas output holes are provided on a side of a rotation direction (a first rotation direction) from the second region toward the first region with respect to a reference plane including a reference point in the shutter and the central axis. The reference point corresponds to a center of the mounting region when the shutter is disposed in the first region. Opening ends of the gas output holes are arranged on a curved line projecting in the rotation direction or on a polygonal line projecting in the rotation direction. A distance between a reference line including the reference point and extending in the vertical direction and each of the gas output holes is greater than a radius of the mounting region. A minimum distance between the central axis and the gas output holes is smaller than or equal to a minimum distance between the central axis and the mounting region. A maximum distance between the central axis and the gas output holes is greater than equal to a maximum distance between the central axis and the mounting region.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
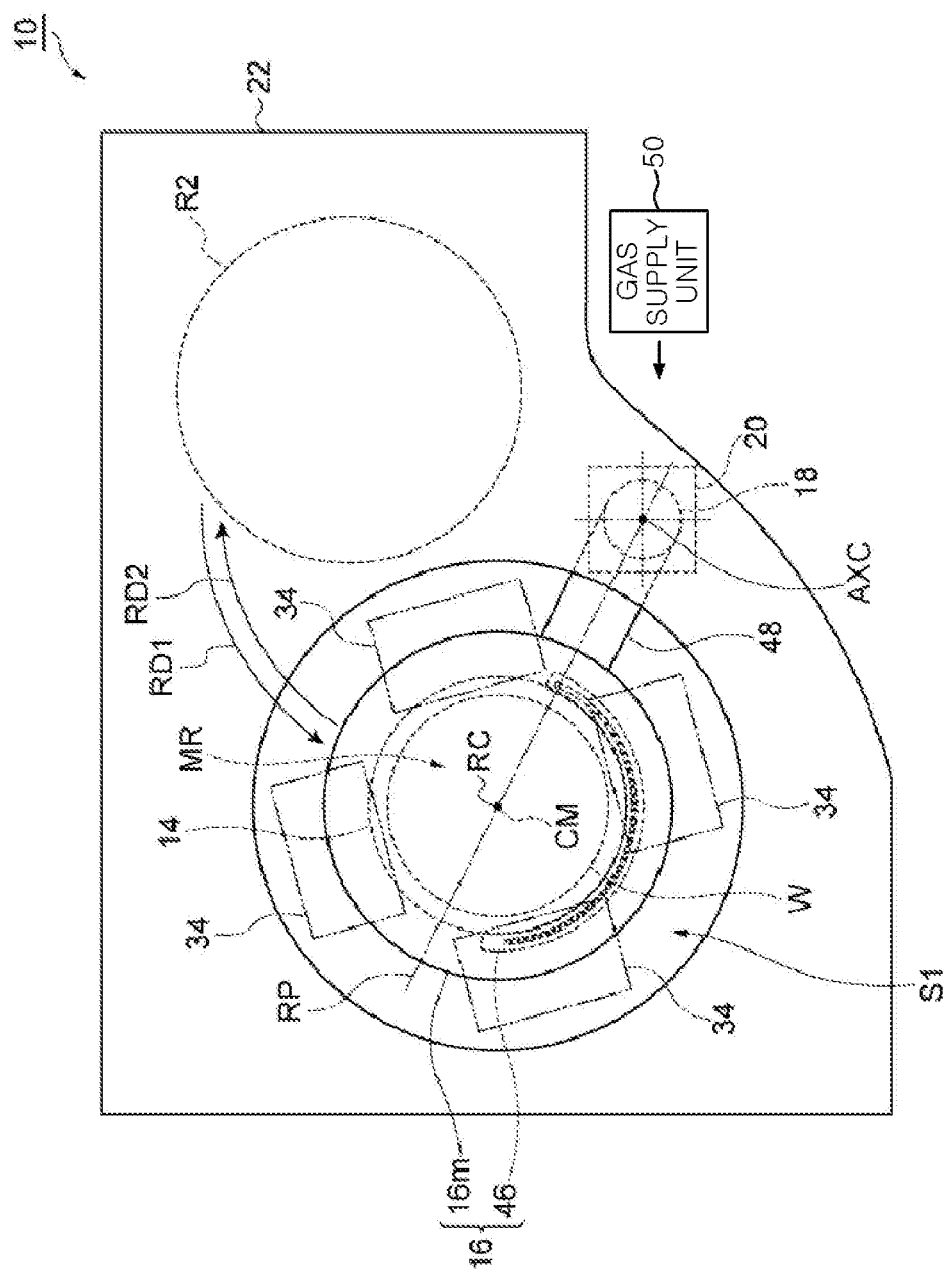
FIG. 1 shows a substrate processing apparatus according to an embodiment and shows a state in which a shutter is disposed in a first region.

Hereinafter, embodiments will be described in detail with reference to the accompanying drawings. Like reference numerals will be given to like or corresponding parts throughout the drawings.

Figure 2:
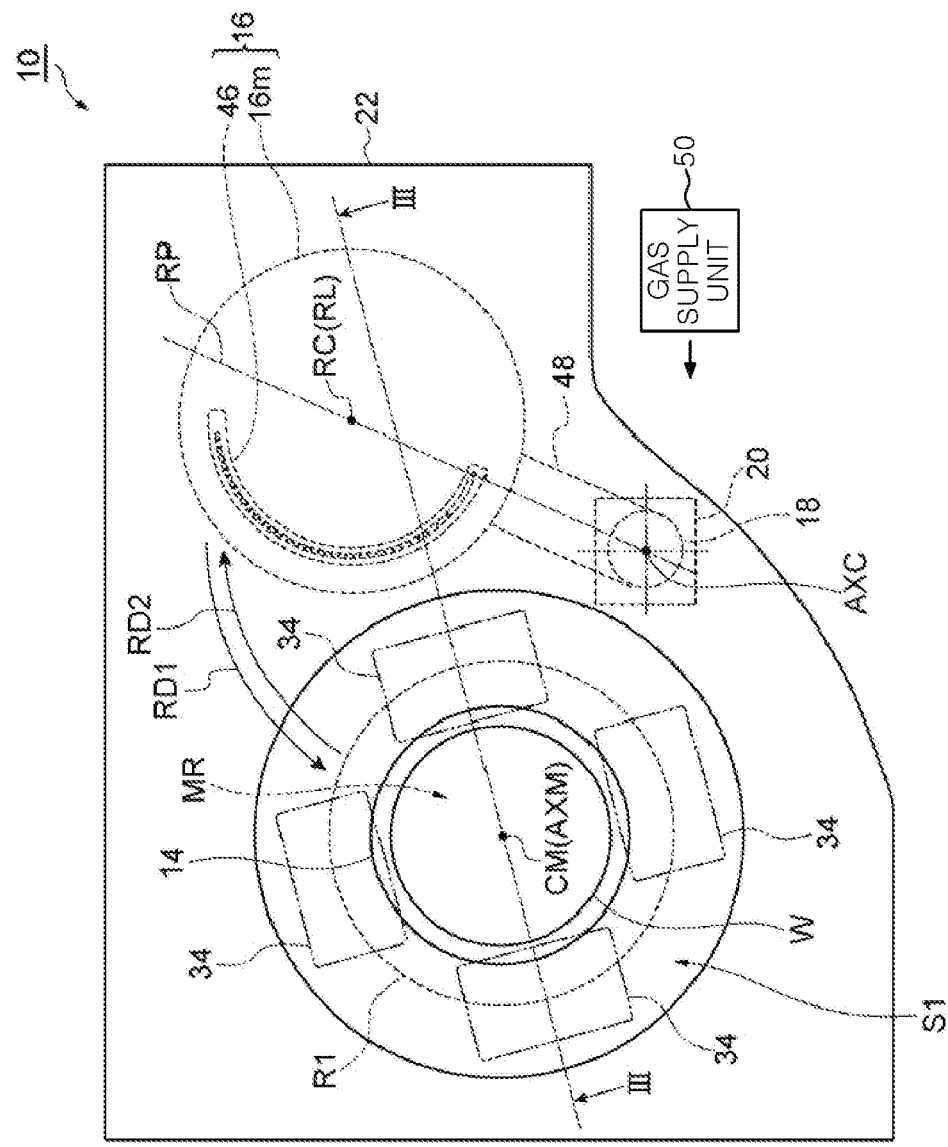
FIG. 2 shows the substrate processing apparatus according to the embodiment and shows a state in which the shutter is disposed in a second region.
Figure 3:
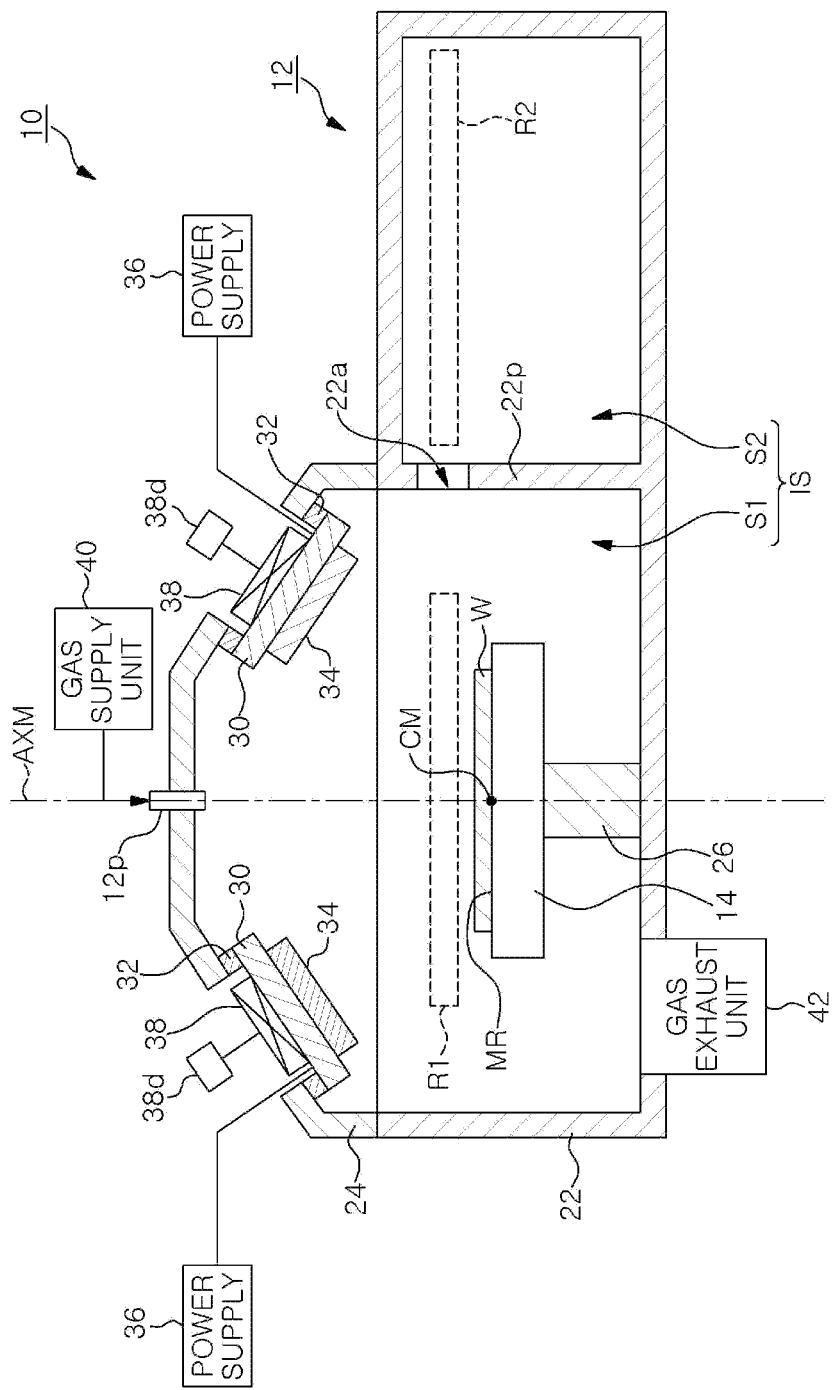
FIG. 3 is a cross sectional view taken along a line III-III of FIG. 2.

FIG. 1 shows a substrate processing apparatus according to an embodiment and shows a state in which a shutter is disposed in a first region. FIG. 2 shows the substrate processing apparatus according to the embodiment and shows a state in which the shutter is disposed in a second region. FIG. 3 is a cross sectional view taken along a line III-III of FIG. 2. In FIG. 3, the illustration of the shutter, a rotation shaft, and a driving unit of the substrate processing apparatus are omitted. The substrate processing apparatus 10 shown in FIGS. 1 to 3 includes a chamber 12, a supporting table 14, a shutter 16, a rotation shaft 18, and a driving unit 20.

The chamber 12 provides an inner space IS. The inner space IS includes a first space S1 and a second space S2. In the first space S1, substrate processing is performed. The second space S2 is provided next to the first space S1. As will be described later, the shutter 16 retreated from the first space S1 is disposed in a second region R2 in the second space S2.

In one embodiment, the chamber 12 has a chamber body 22 and a lid 24. The chamber body 22 is made of a metal such as aluminum. The upper end of the chamber body 22 is partially opened. The lid 24 is made of a metal such as aluminum. The lid 24 is provided on the chamber body 22 to block the opening at the upper end of the chamber body 22. The first space S1 is defined by the chamber body 22 and the lid 24. The second space S2 is defined by the chamber body 22. The chamber body 22 includes a partition wall 22*p*. The partition wall 22*p* extends between the first space S1 and the second space S2. An opening 22*a* is formed in the partition wall 22*p*. The shutter 16 moves between the first space S1 and the second space S2 through the opening 22*a*. The substrate processing apparatus 10 may include a member configured to open and close the opening 22*a*.

The supporting table 14 is provided in the first space S1 of the inner space IS. The supporting table 14 is supported by a support member 26. The support member 26 extends upward from a bottom portion of the chamber body 22. An upper surface of the supporting table 14 includes a mounting region MR. The substrate W can be mounted on the mounting region MR. On the mounting region MR, the substrate W is substantially horizontally mounted. The substrate W has the same disc shape as that of a wafer. The mounting region MR has a circular shape. The mounting region MR has the substantially same diameter as that of the substrate W.

In one embodiment, the substrate processing apparatus 10 is a film forming apparatus. In the present embodiment, the substrate processing apparatus 10 is configured to form a film on the substrate W by physical vapor deposition. Specifically, in the present embodiment, the substrate processing apparatus 10 includes one or more holders 30. Each holder 30 is made of a metal. Each holder 30 is held by the lid 24 through a holding member 32. The member 32 has an insulating property. Each holder 30 holds a target 34 above the supporting table 14 and the first region R1 to be described later. The target 34 is made of a material to be deposited on the substrate W.

In one example, the substrate processing apparatus 10 may include four holders 30. In that case, the four holders 30 are provided such that four targets 34 are arranged along a conical surface about an axis AXM. The axis AXM passes through the center CM of the mounting region MR and extends in the vertical direction.

One or more power supplies 36 are electrically connected to one or more holders 30, respectively. The power supplies 36 generate voltages to be applied to corresponding holders 30. Voltages from one or more power supplies 36 are respectively applied to one or more targets 34 through one or more holders 30. The power supplies 36 may be DC power supplies or high frequency power supplies. When the power supplies 36 are high frequency power supplies, the power supplies 36 are connected to the holders 30 via matching units, respectively. The matching units are configured to make an impedance of a load side close or equal to a matching point. A single power supply 36 may be electrically connected to a plurality of holders 30 and apply a voltage to the holders 30.

The substrate processing apparatus 10 may further include one or more cathode magnets 38. The cathode magnets 38 are provided outside the lid 24 to face the corresponding targets 34 with the corresponding holders 30 therebetween. A magnet driving unit 38*d* is connected to each cathode magnet 38.

The chamber 12 is provided with a port 12*p*. In one embodiment, the port 12*p* is provided at the lid 24. The port 12*p* provides a flow path for introducing a gas into the first space S1 of the inner space IS. A gas supply unit 40 is connected to the port 12*p*. The gas is supplied from the gas supply unit 40 to the first space S1 of the inner space IS through the port 12*p*. The gas supplied to the first space S1 may be a rare gas or an inert gas such as nitrogen gas.

A gas exhaust unit 42 is connected to the chamber 12. The gas exhaust unit 42 is configured to set a pressure in the inner space IS to a specified pressure. The gas exhaust unit 42 includes a pressure controller such as a pressure control valve, and a depressurization pump such as a turbo molecular pump and a dry pump.

In the case of forming a film on the substrate W by physical vapor deposition in the substrate processing apparatus 10, the shutter 16 is disposed in the second region R2 in the second space S2. The substrate W is mounted on the mounting region MR. A gas is supplied from the gas supply unit 40 to the first space S1 of the inner space IS, and the pressure in the inner space IS is set to the specified pressure by the gas exhaust unit 42. Voltages are applied from one or more power supplies 36 to one or more targets 34. The cathode magnets 38 are driven by one or more magnet driving units 38*d*. Accordingly, plasma is generated near the targets 34. Positive ions in the plasma collide with the targets 34 and, thus, particles are released from the targets 34. The particles released from the targets 34 are deposited on the substrate W. As a result, a film is formed on the substrate W.

Figure 4:
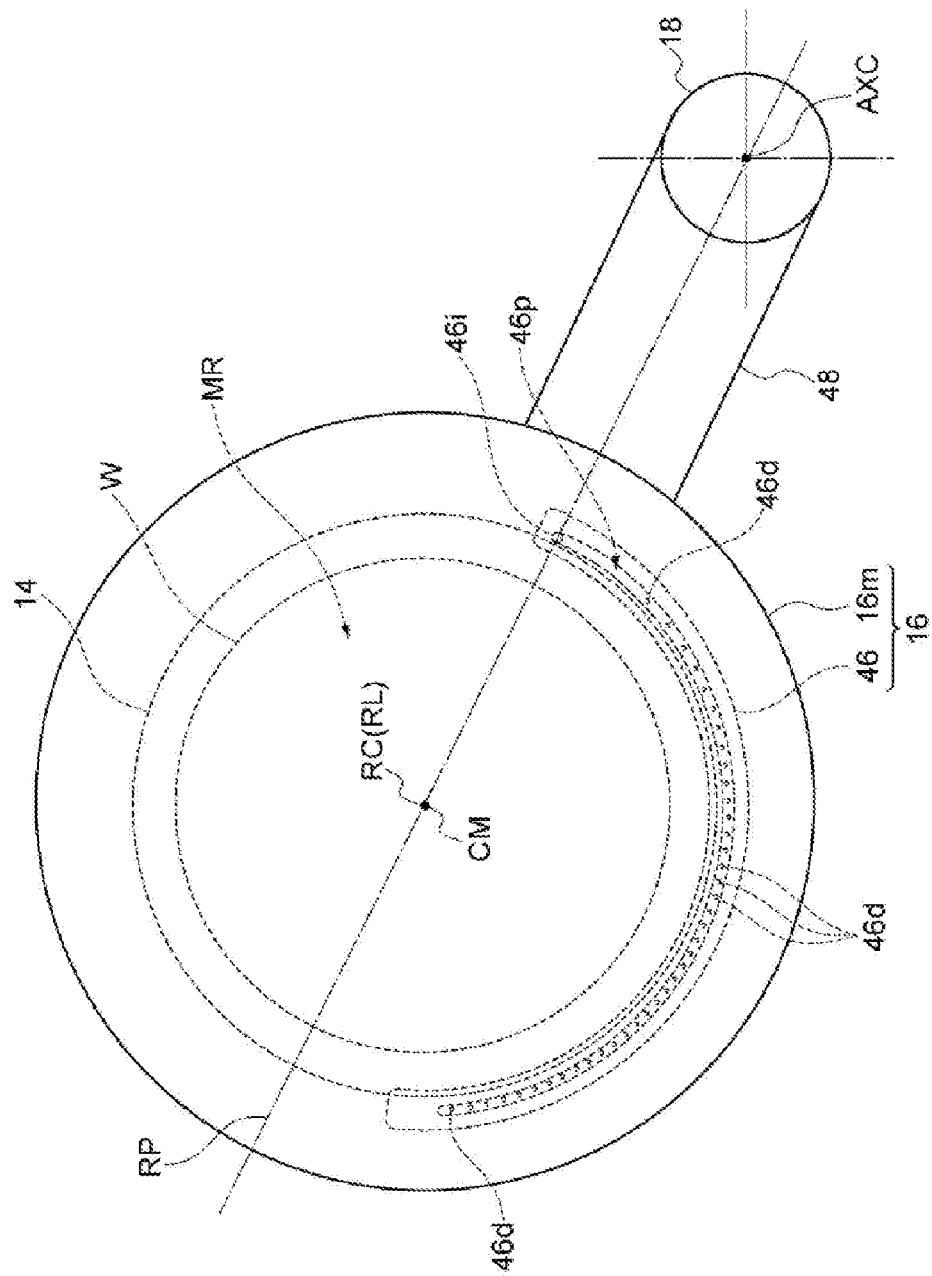
FIG. 4 is a plan view showing a shutter and a rotation shaft of the substrate processing apparatus shown in FIGS. 1 to 3.
Figure 5:
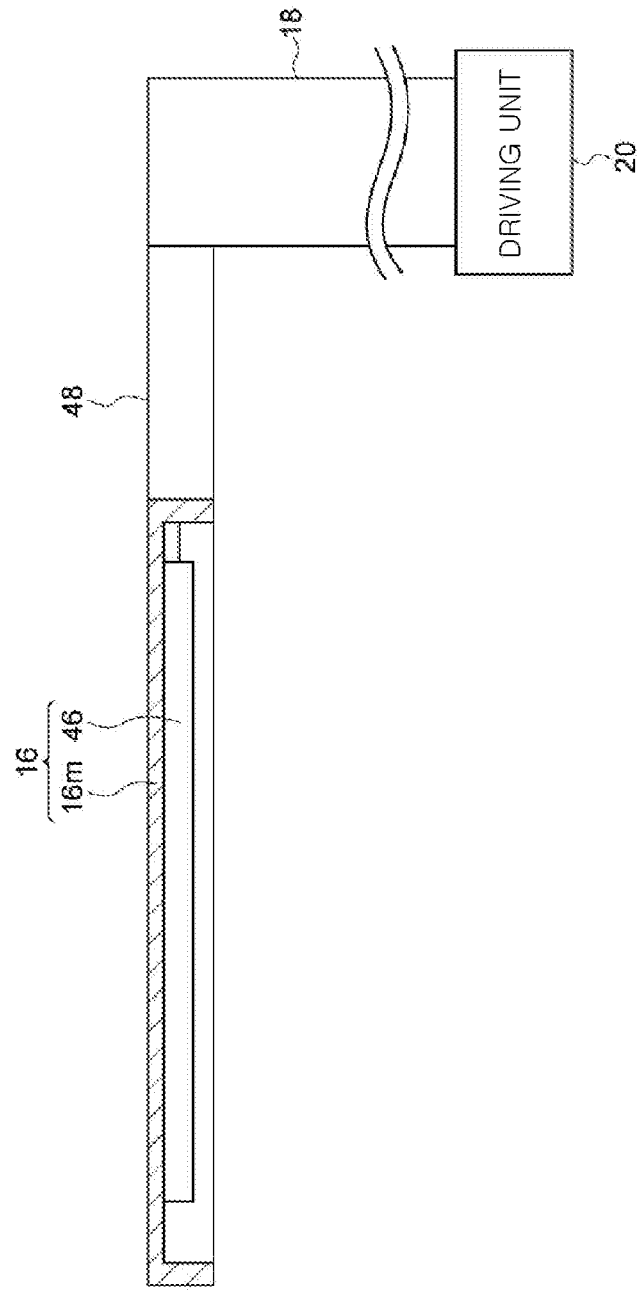
FIG. 5 is a side view showing the shutter, the rotation shaft, and a driving unit of the substrate processing apparatus shown in FIGS. 1 to 3.

Hereinafter, the shutter 16, the rotation shaft 18 and the driving unit 20 will be described with reference to FIGS. 1 to 5. FIG. 4 is a plan view showing the shutter and the rotation shaft of the substrate processing apparatus shown in FIGS. 1 to 3. In FIG. 4, the shutter is viewed from the top. FIG. 5 is a side view of the shutter, the rotation shaft and the driving unit of the substrate processing apparatus shown in FIGS. 1 to 3. In FIG. 5, the shutter is shown in a state where the main body is broken.

The shutter 16 has a main body 16*m* and a pipe 46. The shutter 16 is configured to cover the mounting region MR when the shutter 16 is disposed in the first region R1. The first region R1 is provided above the supporting table 14 in the first space S1. When the main body 16*m* of the shutter 16 is disposed in the first region R1, the mounting region MR is covered by the main body 16*m*. The minimum width of the main body 16*m* is greater than the diameter of the mounting region MR. In one embodiment, the main body 16*m* has a substantially disc shape. In the present embodiment, the size of the main body 16*m* is greater than the diameter of the mounting region MR and the diameter of the substrate W.

The pipe 46 is fixed to a lower surface of the main body 16*m*. The pipe 46 provides a plurality of gas output holes 46*d*. The gas output holes 46*d* are opened downward. The gas from a gas supply unit 50 (see FIG. 1 or 2) is outputted from the opening ends of the gas output holes 46*d*. In one embodiment, the lower surface of the main body 16*m* provides a recess. The pipe 46 is disposed in the recess. The pipe 46 may be a part of the main body 16m. The pipe 46 will be described in detail later.

The shutter 16 is supported by the rotation shaft 18. The rotation shaft 18 is spaced apart from the supporting table 14. The rotation shaft 18 extends in the vertical direction. In one embodiment, the rotation shaft 18 is provided in the second space S2. The rotation shaft 18 may have a substantially columnar shape, for example. The shutter 16 is fixed to the rotation shaft 18 through a connecting part 48. The connecting part 48 extends in a direction perpendicular to the central axis AXC of the rotation shaft 18.

The driving unit 20 is configured to rotate the rotation shaft 18 about the central axis AXC and move the shutter 16 between the first region R1 and the second region R2. The driving unit 20 is, e.g., a motor, and is provided outside the chamber 12.

In the substrate processing apparatus 10, when a film is formed on the substrate W by physical vapor deposition, the shutter 16 is disposed in the second region R2 as described above. When the film on the substrate W is processed, in a state where the gas is outputted from the gas output holes 46d, the rotation shaft 18 is rotated by the driving unit 20 to move the shutter 16 above the substrate W in a first rotation direction RD1 and/or a second rotation direction RD2. As shown in FIGS. 1 and 2, the first rotation direction RD1 is a direction in which the shutter 16 moves from the second region R2 to the first region R1 by the rotation of the rotation shaft 18 about the central axis line AXC. The second rotational direction RD2 is a direction in which the shutter 16 moves from the first region R1 to the second region R2 by the rotation of the rotation shaft 18 about the central axis AXC. In one example, a metal film such as a magnesium film is formed on the substrate W by physical vapor deposition in the substrate processing apparatus 10. Further, in one example, an oxygen-containing gas (e.g., $O_2$ gas) is outputted from the gas output holes 46d. In this example, the metal film on the substrate W is converted to a metal oxide film.

Figure 6:
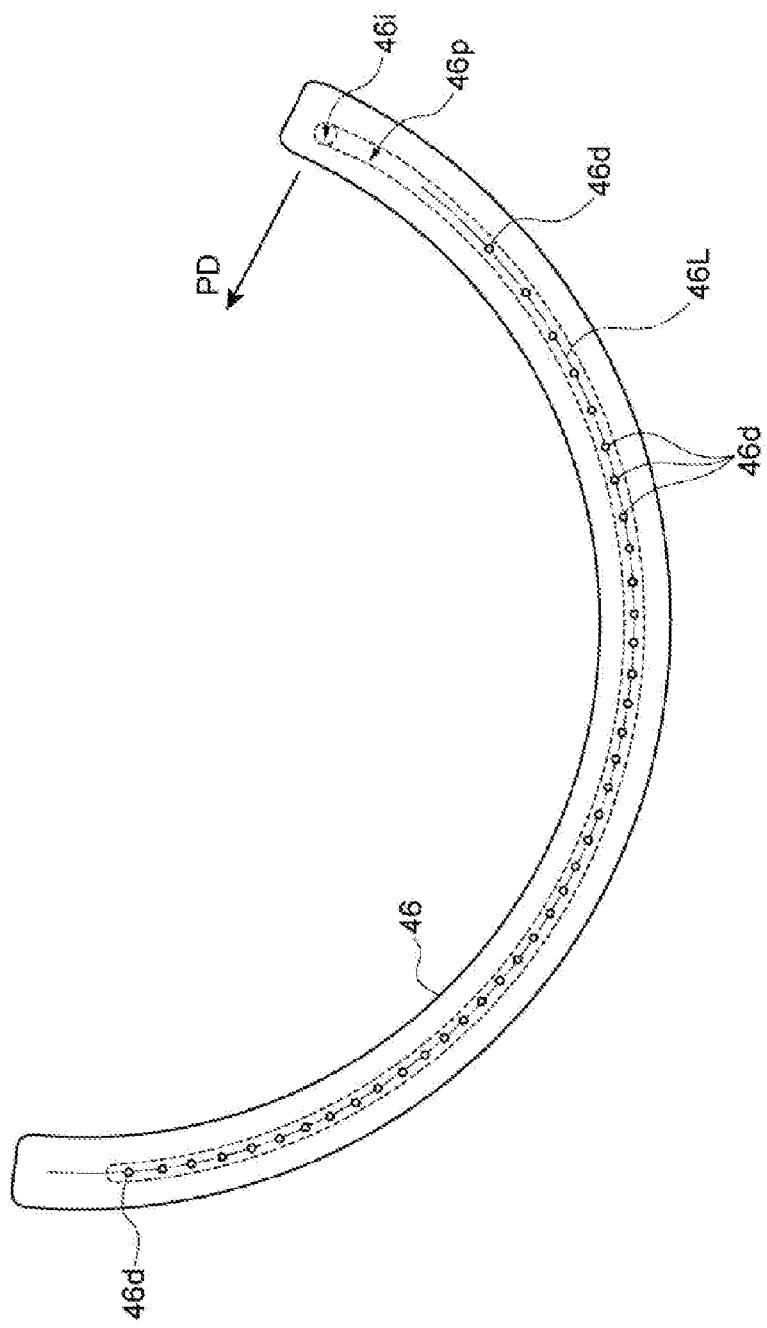
FIG. 6 is a plan view showing a pipe of the shutter shown in FIGS. 4 and 5.
Figure 7:
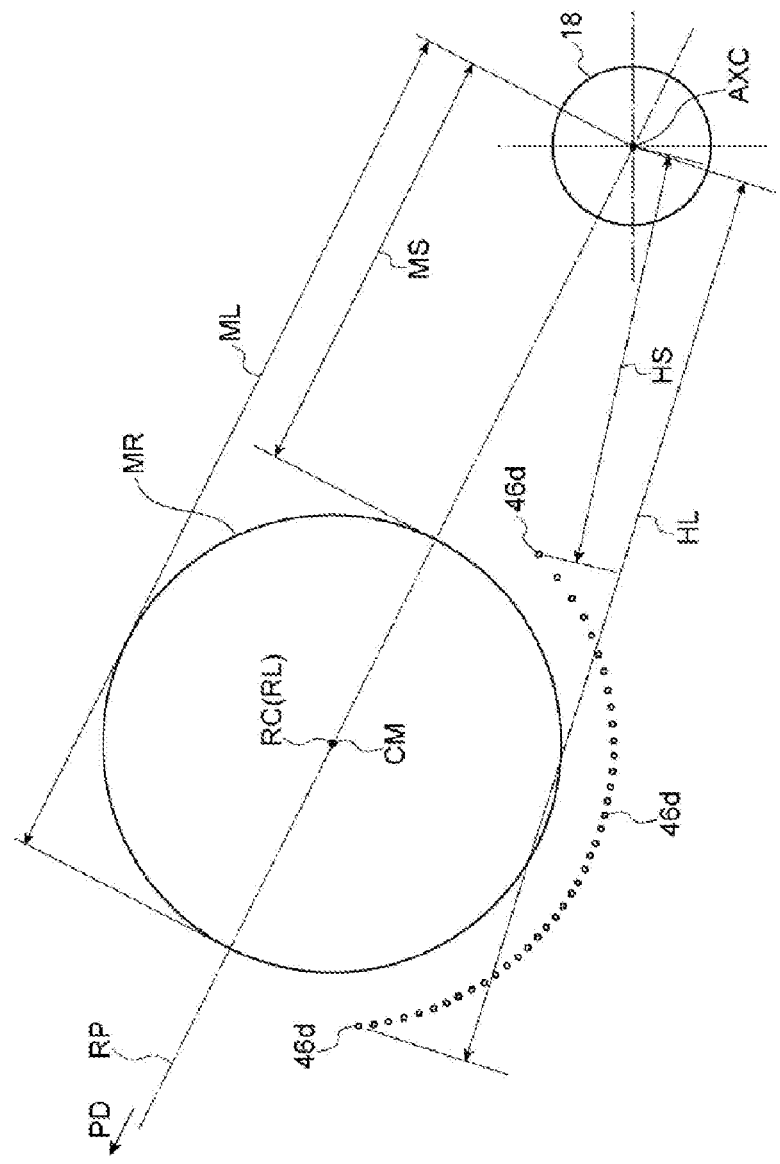
FIG. 7 is a plan view showing positional relation among a plurality of gas output holes, a rotation shaft, and a mounting region.
Figure 8:
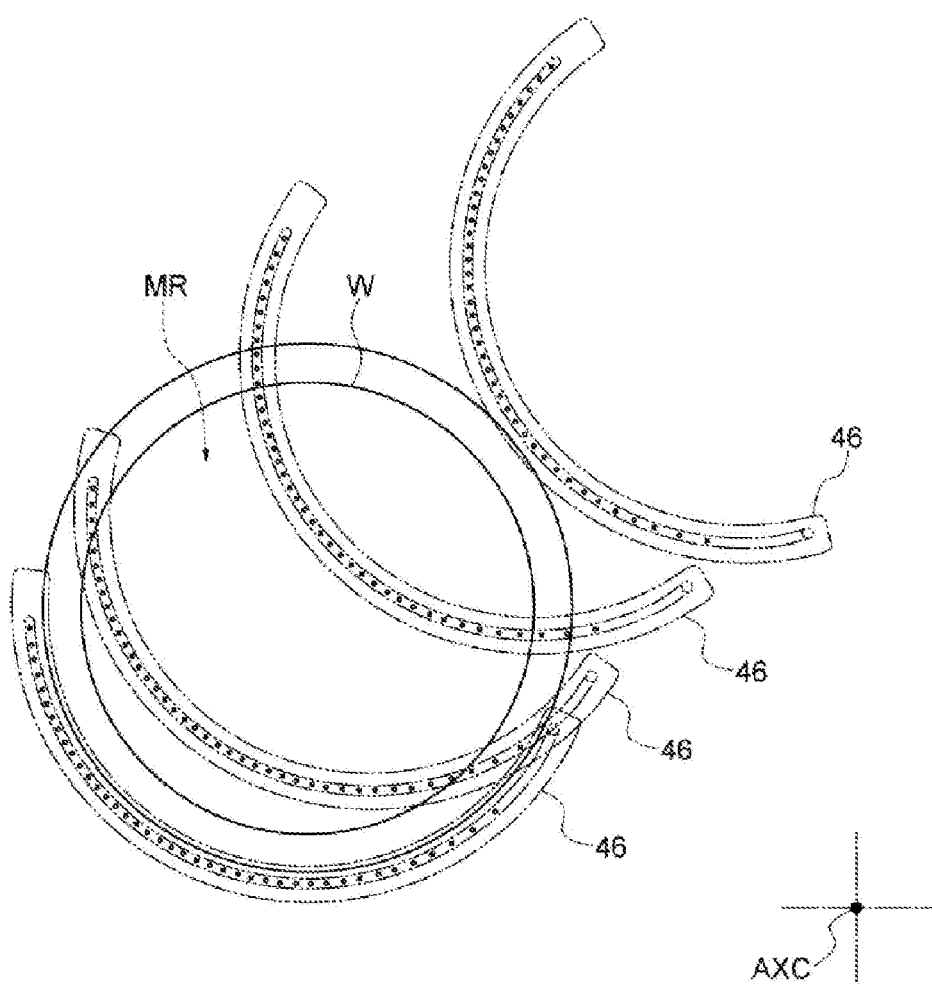
FIG. 8 is a plan view showing a state in which the pipe of the shutter shown in FIGS. 4 and 5 is scanned.

Hereinafter, the gas output holes 46d will be described in detail with reference to FIGS. 1 to 8. FIG. 6 is a plan view of the pipe of the shutter shown in FIGS. 4 and 5. In FIG. 6, the pipe 46 is viewed from the bottom. FIG. 7 is a plan view showing positional relation between the gas output holes, the rotation shaft and the mounting region. In FIG. 7, the gas output holes 46d, the rotation shaft 18 and the mounting region MR are viewed from the top. FIG. 8 is a plan view showing a state in which the pipe of the shutter shown in FIGS. 4 and 5 is scanned.

As shown in FIGS. 4 and 6, the pipe 46 provides a flow path 46p. The flow path 46p extends from one end side to the other end side of the pipe 46. The one end side of the pipe 46 is closer to the central axis AXC of the rotation shaft 18 compared to the other end side. The gas output holes 46d extend downward from the flow path 46p. The pipe 46 further provides an inlet 46i. The inlet 46i is connected to the flow path 46p. The inlet 46i is provided at the one end side of the pipe 46 with respect to the gas output holes 46d. The gas from the gas supply unit 50 is introduced into the inlet 46i. The gas introduced into the inlet 46i flows along the flow path 46p and is outputted through the gas output holes 46d.

The gas output holes 46d are provided on the first rotation direction RD1 side with respect to a reference plane RP (see FIG. 4 or the like). The reference plane RP includes a reference point RC in the shutter 16 and the central axis AXC of the rotation shaft 18. The reference point RC is a point in the shutter 16. The reference point RC corresponds to the center CM of the mounting region MR when the shutter 16 is disposed in the first region R1 to cover the mounting region MR or the substrate W. In one embodiment, the reference point RC is the center of the shutter 16 (or the main body 16m).

The opening ends of the gas output holes 46d are arranged on a line 46L (see FIG. 6). The opening ends of the gas output holes 46d are lower opening ends of the gas output holes 46d. In one embodiment, the line 46L is a curved line projecting in the first rotational direction RD1. In one example, the line 46L is an arc having a reference line RL as the center of curvature thereof. The reference line RL includes the reference point RC and extends in the vertical direction. In this example, the pipe 46 and the flow path 46p may extend along the line 46L that is an arc. The line 46L may be a polygonal line projecting in the first rotation direction RD1.

The distance between each gas output hole 46d (or the opening end thereof) and the reference line RL is greater than the radius of the mounting region MR. In one example, the radius of curvature of the arc line 46L is greater than the radius of the mounting region MR and the radius of the substrate W. As shown in FIG. 7, the minimum distance HS between the center axis AXC and the gas output holes 46d (or the opening ends thereof) is smaller than or equal to the minimum distance MS between the central axis AXC and the mounting region MR (or the substrate W). The maximum distance HL between the center axis AXC and the gas output holes 46d (or the opening ends thereof) is greater than or equal to the maximum distance ML between the central axis AXC and the mounting region MR (or the substrate W).

In the substrate processing apparatus 10, the radius of trajectory (hereinafter, referred to as a "first trajectory") in which the gas output hole closest to the central axis AXC of the rotation shaft 18 among the gas output holes 46d moves by the rotation of the rotation shaft 18 is smaller than or equal to the minimum distance MS between the central axis AXC and the mounting region MR (or the substrate W). The radius of trajectory (hereinafter, referred to as a "second trajectory") in which the gas output hole 46d farthest from the central axis AXC of the rotation shaft 18 among the gas output holes 46d moves by the rotation of the rotation shaft 18 is greater than or equal to the maximum distance ML between the central axis AXC and the mounting region MR (or the substrate W). The other gas output holes move between the first trajectory and the second trajectory by the rotation of the rotation shaft 18. Therefore, when the rotation shaft 18 rotates, the gas from the gas output holes 46d is irradiated to the entire surface of the substrate W, i.e., the entire top surface of the substrate W which is opposite to the backside of the substrate W facing the supporting table 14.

When the shutter 16 is disposed in the first region R1, the opening ends of the gas output holes 46d are located outside the mounting region MR (or the substrate W) in the first rotation direction RD1 (see FIGS. 1, 4, and 8). Therefore, the gas from the gas output holes 46d can be supplied to the entire surface of the substrate W without moving the shutter 16 in the first rotation direction RD1 beyond the first region R1. In other words, as shown in FIG. 8, by moving the shutter 16 from the first region R1 in the second rotation direction RD2 and/or moving the shutter to the first region R1 in the first rotation direction RD1, the gas from the gas output holes 46d can be supplied to the entire surface of the substrate W. Therefore, it is possible to supply the gas from the gas output holes 46d to the entire surface of the substrate W even when the inner space IS on the first rotation direction RD1 side with respect to the first region R1 is small.

In one embodiment, the interval between the adjacent gas output holes 46d is set such that the distribution of the amount of gas outputted from the gas output holes 46d can become uniform in the radial direction with respect to the central axis AXC. Specifically, as shown in FIGS. 6 and 7, the distance in a predetermined direction PD between two first gas output holes that are any two adjacent gas output holes among the gas output holes 46d is smaller than the distance in the predetermined direction PD between two second gas output holes that are any two adjacent gas output holes closer to the inlet 46i in the pipe 46 compared to the two first gas output holes among the gas output holes 46d. The predetermined direction PD is parallel to the reference plane RP and perpendicular to the central axis AXC.

In other words, in the arrangement of the gas output holes 46d, the interval between two adjacent gas output holes 46d on one end side closest to the inlet 46i is largest. In the arrangement of the gas output holds 46d, the interval between two adjacent gas output holes 46d on the other end side farthest from the inlet 46i is second largest. In the arrangement of the gas output holes 46d, the interval between two adjacent central gas outlet holes 46d is smallest. The distance between two adjacent gas output holes 46d is decreased from one end side toward the center of the arrangement of the gas output holes 46d. Further, the distance between two adjacent gas output holes 46d is decreased from the other end side toward the center of the arrangement of the gas output holes 46d.

A flow rate of the gas outputted from the gas output holes 46d farther from the inlet 46i is smaller than that of the gas outputted from the gas output holes 46d closer to the inlet 46i. In the above embodiment, the gas output holes 46d are densely arranged along the predetermined direction PD at a portion farther from the inlet 46i than at a portion closer to the inlet 46i. Therefore, the distribution of the amount of gas outputted from the gas output holes 46d in the direction perpendicular to the central axis AXC (i.e., in the predetermined direction PD) is relatively uniform. As a result, in-plane uniformity of the substrate processing by the gas outputted from the gas output holes 46d is improved.

As described above, in the substrate processing apparatus having no rotation mechanism for the supporting table, it is possible to supply a gas to the entire surface of the substrate, i.e., the entire top surface of the substrate opposite to the backside of the substrate facing the supporting table.

While various embodiments have been described, the present disclosure can be variously modified without being limited to the above-described embodiments. For example, the substrate processing apparatus 10 may be different from a film forming apparatus. In other words, the substrate processing apparatus 10 may be any substrate processing apparatus as long as it includes the shutter 16.

While the present disclosure has been shown and described with respect to the embodiments, it will be understood by those skilled in the art that various changes and modifications may be made without departing from the scope of the present disclosure as defined in the following claims.

What is claimed is:

1. A substrate processing apparatus comprising:
 a chamber providing an inner space;
 a supporting table provided in the inner space, the supporting table having a mounting region for mounting a disc-shaped substrate;
 a shutter configured to cover the mounting region when the shutter is disposed in a first region above the supporting table, the shutter having a pipe providing a plurality of gas output holes opened downward;
 a rotation shaft configured to support the shutter and spaced apart from the supporting table, the rotation shaft extending in a vertical direction; and
 a driving unit configured to move the shutter between the first region and a second region spaced apart from the supporting table by rotating the rotation shaft about a central axis thereof,
 wherein the gas output holes are provided on a side of a rotation direction from the second region toward the first region with respect to a reference plane including a reference point in the shutter and the central axis,
 the reference point corresponds to a center of the mounting region when the shutter is disposed in the first region,
 opening ends of the gas output holes are arranged on a curved line projecting in the rotation direction or on a polygonal line projecting in the rotation direction,
 a distance between a reference line including the reference point and extending in the vertical direction and each of the gas output holes is greater than a radius of the mounting region,
 a minimum distance between the central axis and the gas output holes is smaller than or equal to a minimum distance between the central axis and the mounting region, and
 a maximum distance between the central axis and the gas output holes is greater than equal to a maximum distance between the central axis and the mounting region.

2. The substrate processing apparatus of claim 1, wherein the pipe extends along an arc, and
 opening ends of the gas output holes are arranged on an arc having the reference line as a center of curvature thereof.

3. The substrate processing apparatus of claim 2, wherein the pipe provides an inlet for introducing a gas on the central axis side with respect to the gas output holes, and a distance in a predetermined direction between two first gas output holes that are any two adjacent gas output holes among the gas output holes is smaller than a distance in the predetermined direction between two second gas output holes that are any two adjacent gas output holes closer to the inlet in the pipe compared to the two first gas output holes among the gas output holes, and
 the predetermined direction is parallel to the reference plane and perpendicular to the central axis.

4. The substrate processing apparatus of claim 1, further comprising:
 a holder configured to hold a target above the supporting table and the first region; and
 a power supply configured to apply a voltage to the holder.

5. The substrate processing apparatus of claim 2, further comprising:
 a holder configured to hold a target above the supporting table and the first region; and
 a power supply configured to apply a voltage to the holder.

6. The substrate processing apparatus of claim 3, further comprising:
 a holder configured to hold a target above the supporting table and the first region; and a power supply configured to apply a voltage to the holder.

* * * * *